United States Patent [19]

Kelley

[11] 4,387,345
[45] Jun. 7, 1983

[54] PRECISION GAIN AC COUPLED OPERATIONAL AMPLIFIER

[75] Inventor: Stephen H. Kelley, Austin, Tex.

[73] Assignee: Motorola, Inc., Schaumburg, Ill.

[21] Appl. No.: 246,809

[22] Filed: Mar. 24, 1981

[51] Int. Cl.³ .............................................. H03F 1/32
[52] U.S. Cl. ........................................ 330/9; 330/97;
330/107; 330/108; 330/110
[58] Field of Search ...................... 330/9, 97, 107, 108,
330/290, 110; 307/520; 328/127, 167; 333/173

[56] References Cited

U.S. PATENT DOCUMENTS 4,210,872 7/1980 Gregorian .............................. 330/9

Primary Examiner—James B. Mullins
Attorney, Agent, or Firm—Anthony J. Sarli, Jr.; Jeffrey Van Myers; Robert L. King

[57] ABSTRACT

A precision gain AC coupled operational amplifier circuit utilizing an integrated resistor voltage divider network and switched capacitors is provided. Precise gain is obtained by the use of integrated capacitors, and a low frequency stabilizing pole in the order of 10 Hertz is created by proper selection of the ratio of the resistors in the divider network.

8 Claims, 4 Drawing Figures

PRECISION GAIN AC COUPLED OPERATIONAL AMPLIFIER

BACKGROUND OF THE INVENTION

1. Field of the Invention

This invention relates generally to AC coupled operational amplifier circuits and more particularly to AC coupled operational amplifiers providing a precise gain and a low frequency stabilizing pole.

2. Description of the Prior Art

Typically, integrated precise inverting AC coupled operational amplifiers are limited in ability to implement stabilizing low frequency poles. Since an AC coupled operational amplifier must have DC feedback in order to be stable, it is desirable to have the lowest stabilizing low frequency pole which is possible to obtain. A low frequency pole also allows an AC coupled operational amplifier to have unity gain at DC. To implement a low frequency pole, a large load resistance of several meg-ohms is required, generally necessitating the use of components external to the integrated circuit. The use of a switched capacitor to simulate a resistor is well known in the art of integrated operational amplifier circuits. However, when switched capacitor techniques are used, the clock frequencies of the switched capacitors generally must be at least ten times greater than the highest pass band frequency of the circuit to prevent errors such as aliasing and sampling distortion. Therefore the clock frequencies must be as much as one thousand times greater than the lowest pole frequency of the circuit. The simulation of a resistance in the tens of meg-ohm range at clock frequencies in the hundreds of kilo-hertz range requires a switched capacitance on the order of one thousandth of a pico-farad if the other capacitors of the circuit are to be kept below a practical value of ten pico-farads. Since the best capacitors which are currently manufactured have an inherent parasitic element which is much greater than one thousandth of a pico-farad, it is not possible to simulate a resistance in the tens of meg-ohm range with a switched capacitor.

SUMMARY OF THE INVENTION

It is an object of the present invention to provide an AC coupled inverting operational amplifier having a precise gain and a low frequency stabilizing pole.

It is a further object of the invention to provide a precision gain MOS AC coupled inverting operational amplifier utilizing integrated capacitors, resistors and switching means to produce a low frequency pole.

According to a broad aspect of the invention there is provided an AC coupled operational amplifier having a feedback capacitor connected in the inverting gain configuration. Coupled in parallel with the feedback capacitor is a resistor divider network which selectively couples charge from the output of the operational amplifier to the inverting input by means of two clocked switches. The switches are clocked by non-overlapping signals of pre-determined frequency. The ratio of resistors in the divider network allows implementation of a low frequency pole with integrated components, and precise capacitors can be fabricated in a standard MOS process to produce a precision gain AC coupled operational amplifier with a DC gain of unity.

DESCRIPTION OF THE PREFERRED EMBODIMENT

Figure 1:
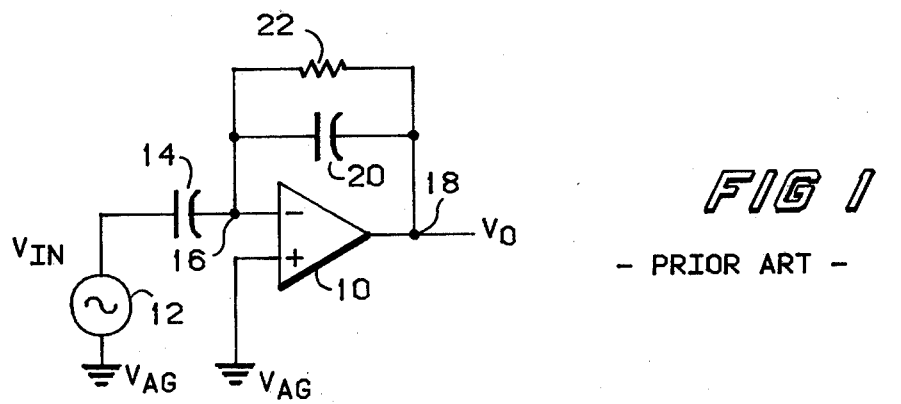
FIG. 1 is a schematic diagram illustrating one example of the prior art.

Shown in FIG. 1 is an AC coupled inverting operational amplifier 10 which is well known in the prior art. The operational amplifier 10 has its inverting or negative input couled to an input signal source 12, $V_{IN}$, via coupling capacitor 14 which blocks out all DC inputs. The non-inverting or positive input of the operational amplifier 10 is connected to a common reference voltage, say analog ground $V_{ag}$. Feedback capacitor 20 and load resistor 22 are coupled at the negative input of operational amplifier 10 at node 16 to the output of operational amplifier 10 at node 18.

In this configuration, the gain of operational amplifier 10 is $$(C_{14}/C_{20})[R_{22}C_{20}/(1+R_{22}C_{20})]$$

and therefore the precision of the gain is determined in large part by the exactness of capacitors 14 and 20. In a standard MOS process, the capacitors 14 and 20 can be accurately fabricated to produce a nearly exact gain amplifier or closely matched to produce a precise unity gain amplifier. The low frequency pole of the circuit in FIG. 1 is $$F_{lo}=1/(2R_{22}C_{20}).$$

By utilizing a standard process value for feedback capacitor $C_{20}$ of 5 pF and designing a low frequency pole of 10 hertz, the load resistor $R_{22}$ would need to be approximately $3.18 \times 10^9$ ohms. Such a large resistance is impractical to integrate into the circuit. Furthermore, in order to simulate this large resistance by using a switched capacitor, a clocking frequency in the kilohertz range is required to prevent the introduction of offset voltage error from the switching. Using a lower clock frequency which is on the order of the input signal frequency would cause discrete modifications to the DC level at frequencies similar to the frequency of the input signal which is being amplified and thus the output would be distorted. Therefore, the switched capacitor value would have to be approximately 0.001 pF.

Figure 2:
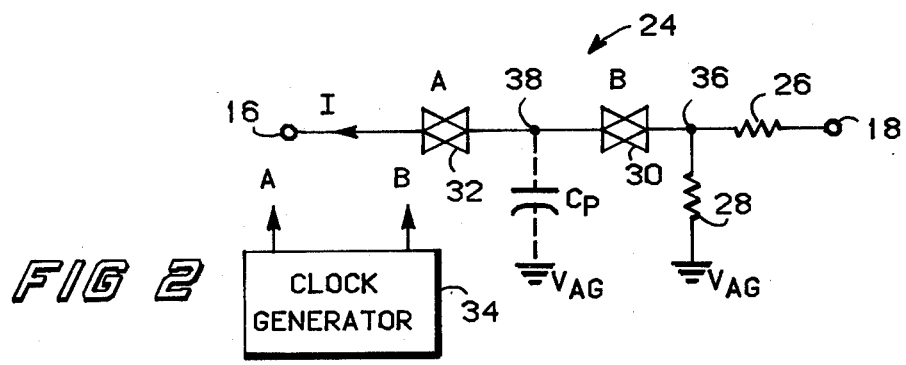
FIG. 2 is a schematic diagram illustrating one preferred embodiment of the invention.
Figure 3:
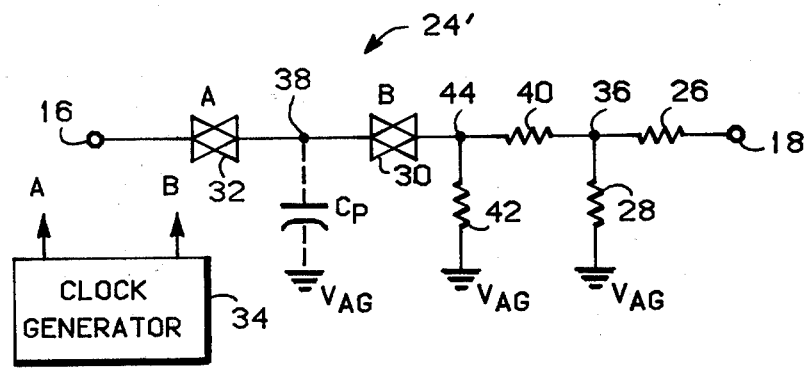
FIG. 3 is a schematic diagram illustrating another embodiment of the invention.
Figure 4:
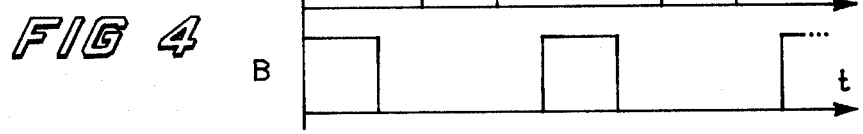
FIG. 4 is a graphic timing diagram for the schematic embodiment shown in FIG. 3.

To overcome these problems, a switched voltage divider circuit 24 as shown in FIG. 2 may be substituted for $R_{22}$ in the circuit of FIG. 1 at the nodes 16 and 18. In the preferred embodiment, the voltage divider 24 comprises the resistors 26 and 28 and switches 30 and 32 wherein the switches are CMOS transmission gates having an inherent parasitic capacitance, $C_p$, and which are clocked in a conventional manner by nonoverlapping clock signals A and B (see FIG. 4) by clock generator 34. Initially, switch 30 is on and switch 32 is off so that $C_p$ charges to the voltage at node 36 of the divider circuit 24 which is $R_{28}/(R_{28}+R_{26})$ of the output voltage, $V_0$, at node 18. Switch 30 is switched off and then switch 32 is switched on to couple charge into the inverting operational amplifier 10. Therefore the current I flowing through switch 32 and into node 16 is $[R_{28}/(R_{28}+R_{26})] V_ofC_p$. It is thus apparent that the equivalent of the resistance which is being simulated between nodes 16 and 18 of voltage divider circuit 24 is $[(R_{28}+R_{26})/R_{28}]fC_p$. The obstacle of not being able to realize an integrated load resistance of $3.18 \times 10^9$ ohms can be overcome by utilizing the proper ratio of resistors $R_{26}$ and $R_{28}$. If the switched capacitor has a parasitic capacitance of approximately 0.2 pF and a clock frequency of 128 KHz is used, the ratio $(R_{28}+R_{26})/R_{28}$ need only be about 81/1 to realize an equivalent to a resistor having a value of $3.18 \times 10^9$ ohms. The resulting low frequency pole allows the AC couled operational amplifier 10 to be used at near DC frequencies. This is especially useful since integrated capacitors can be matched more accurately than integrated resistors in an MOS fabrication process. Higher low frequency poles may be realized by utilizing an actual capacitor in addition to the inherent parasitic capacitance of the switches 30 and 32. When such a capacitor is used, it is located between the node 38 and the reference voltage, $V_{ag}$, where the capacitor $C_p$ is shown in FIGS. 2 and 3. Therefore a totally integrated MOS circuit can be made with precise capacitor ratios to provide a precision gain operational amplifier.

FIG. 3 illustrates in schematic form, a modified form of voltage divider circuit 24' which can be substituted for the voltage divider circuit 24 of FIG. 2 in the circuit of FIG. 1 to reduce the total number of resistor units and thus decrease circuit die area. Resistors 26 and 40 are each made of 7 units of resistance and resistors 28 and 42 are 1 unit of resistance each so that the ratio of resistors 26, 28 and 40 to resistor 42 at node 44 is approximately 81/1. The total number of resistance units needed for divider circuit 24' is therefore 16 as compared to 82 in divider circuit 24.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. An inverting operational amplifier circuit comprising:
    operational amplifier means having an inverting and a non-inverting input and an output, for developing an output voltage proportional to the difference in voltages applied to the inputs thereof;
    capacitive feedback means coupled between the output and the inverting input of the operational amplifier means;
    resistive feedback means coupled between the output of the operational amplifier means and the inverting input thereof, for providing a DC feedback voltage proportional to the amplifier's output voltage, comprising:
        voltage divider means coupled between the output of the operational amplifier means and a reference voltage; and
        switched capacitance means coupled between the voltage divider means and the inverting input of the operational amplifier means.

2. The amplifier circuit of claim 1 wherein said voltage divider means comprise first and second series-connected resistors selected to provide a first divider voltage at the junction thereof having a predetermined relationship to the output voltage.

3. The amplifier circuit of claim 2 wherein said voltage divider means further comprise a third and fourth series-connected resistors coupled to the junction between the first and second resistors of the first divider voltage selected to provide a second divider voltage at the junction between said third and fouth resistors and having a predetermined relationship to the voltage of the first voltage divider.

4. The amplifier circuit of claims 1, 2 or 3 wherein said switched capacitance means comprise two series-connected switching means responsive to respective non-overlapping clock signals and capacitance means coupled between the node connecting the switching means and the reference voltage.

5. The amplier circuit of claim 4 wherein said capacitance means comprise the inherent parasitic capacitance of the switching means.

6. The amplifier circuit of claims 1, 2 or 3 wherein said inverting operational amplifier circuit comprises input capacitance means to provide AC coupling.

7. An inverting operational amplifier circuit having a low frequency pole comprising:
    an operational amplifier, having an inverting and a non-inverting input and an output, for developing an output voltage proportional to the difference in voltages applied to the inputs thereof;
    a feedback capacitor coupled between the inverting input and the output of the operational amplifier;
    a first and a second resistor connected in series between the output of the operational amplifier and a reference voltage, said first and second resistors selected to provide a first divider voltage at the junction therebetween;
    two series-connected switching means responsive to non-overlapping clock signals and having an inherent parasitic capacitance therewith coupled between the junction of the first and second resistors and the inverting input of the operational amplifier; and
    a coupling capacitor connected between the inverting input of the operational amplifier and an input signal.

8. The amplifier circuit of claim 7 further comprising:
    third and fourth series-connected resistors coupled between the junction of the first and second resistors and a reference voltage, said third and fourth resistors selected to provide a second divider voltage at the junction therebetween which is coupled to the two switching means.

* * * * *